United States Patent
Ho et al.

(10) Patent No.: US 10,403,353 B1
(45) Date of Patent: Sep. 3, 2019

(54) SYSTEMS AND METHODS FOR REDUCING COUPLING NOISE BETWEEN PROPAGATION LINES FOR DIE SIZE EFFICIENCY

(71) Applicant: Micron Technology, Inc., Boise, ID (US)

(72) Inventors: Michael V. Ho, Allen, TX (US); Ravi Kiran Kandikonda, Frisco, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/976,705

(22) Filed: May 10, 2018

(51) Int. Cl.
| | |
|---|---|
| *G11C 11/40* | (2006.01) |
| *G11C 11/4096* | (2006.01) |
| *G11C 11/408* | (2006.01) |
| *G11C 11/4076* | (2006.01) |
| *G11C 11/4093* | (2006.01) |

(52) U.S. Cl.
CPC ...... *G11C 11/4096* (2013.01); *G11C 11/4076* (2013.01); *G11C 11/4087* (2013.01); *G11C 11/4093* (2013.01)

(58) Field of Classification Search
CPC ............ G11C 11/4096; G11C 11/4093; G11C 11/4087; G11C 11/4076
See application file for complete search history.

(56) References Cited

U.S. PATENT DOCUMENTS

| | | | |
|---|---|---|---|
| 2012/0113736 A1* | 5/2012 | Kajigaya | G11C 7/02 365/203 |
| 2018/0151200 A1* | 5/2018 | Miyazaki | G11C 7/18 |

* cited by examiner

*Primary Examiner* — Mohammed A Bashar
(74) *Attorney, Agent, or Firm* — Perkins Coie LLP (57) ABSTRACT

Devices, systems, and methods for reducing noise couplings between propagation lines for size efficiency. In one embodiment, a memory device is provided, comprising a memory array and an input/output (I/O) circuit. The I/O circuit can include a first plurality of global data lines and a second plurality of global data lines. The second plurality of global data lines are directly interleaved between the first plurality of global date lines and are configured to shield the first plurality of global data lines. In some embodiments, the first plurality of global data lines are shorter in length than the second plurality of global data lines and are switched before the second plurality of global data lines are switched.

20 Claims, 5 Drawing Sheets

SYSTEMS AND METHODS FOR REDUCING COUPLING NOISE BETWEEN PROPAGATION LINES FOR DIE SIZE EFFICIENCY

TECHNICAL FIELD

The present disclosure is related to systems, devices, and associated methods for reducing noise couplings between propagation lines for die size efficiency. For example, the present disclosure is related to memory devices with a reduced global data path footprint.

BACKGROUND

Memory devices are widely used to store information related to various electronic devices such as computers, wireless communication devices, cameras, digital displays, and the like. Memory devices are frequently provided as internal, semiconductor, integrated circuits and/or external removable devices in computers or other electronic devices. There are many different types of memory, including volatile and non-volatile memory. Volatile memory, including random-access memory (RAM), static random access memory (SRAM), dynamic random access memory (DRAM), and synchronous dynamic random access memory (SDRAM), among others, may require a source of applied power to maintain its data. Non-volatile memory, by contrast, can retain its stored data even when not externally powered. Non-volatile memory is available in a wide variety of technologies, including flash memory (e.g., NAND and NOR), phase change memory (PCM), ferroelectric random access memory (FeRAM), resistive random access memory (RRAM), and magnetic random access memory (MRAM), among others.

Improving memory devices, generally, may include increasing memory cell density, increasing read/write speeds or otherwise reducing operational latency, increasing reliability, increasing data retention, reducing power consumption, or reducing manufacturing costs, among other metrics. One such other metric is reducing the size or footprint of the memory devices and/or components of the memory devices. Many manufacturers achieve size reduction through scaling. Manufacturers can also achieve size reduction through various architectural decisions and/or logic optimizations.

DETAILED DESCRIPTION

As discussed in greater detail below, the technology disclosed herein relates to systems, devices, and associated methods for reducing noise couplings between propagation lines for size efficiency. In particular, the present disclosure is related to memory systems and devices with a reduced global data path footprint. A person skilled in the art, however, will understand that the technology may have additional embodiments, that the technology may include other applications, and that the technology may be practiced without several of the details of the embodiments described below with reference to FIGS. 1-5. In the illustrated embodiments below, the memory devices and systems are primarily described in the context of devices incorporating DRAM storage media. Memory devices configured in accordance with other embodiments of the present technology, however, can include other types of memory devices and systems incorporating other types of storage media, including PCM, SRAM, FRAM, RRAM, MRAM, read only memory (ROM), erasable programmable ROM (EPROM), electrically erasable programmable ROM (EEPROM), ferroelectric, magnetoresistive, and other storage media, including non-volatile, flash (e.g., NAND and/or NOR) storage media.

Several memory devices (e.g., DRAM memory devices) use groups of DC and/or power supply lines to shield dynamic signals sent through data lines in the memory devices. In memory devices with wide input/output (I/O) data and high speed operations, these shields are important to preserve and protect signal integrity. Many of these memory devices include multiple input/output (I/O) circuit configurations to cater to different market segments. Often only one configuration is used, however, meaning that these memory devices carry the remaining configurations as overhead and wasted space. As described in greater detail below, memory devices configured in accordance with embodiments of the present technology use the overhead configurations to replace the shield lines, thereby reducing the size or footprint of global I/O data paths in the memory devices. In addition, these and other memory devices configured in accordance with embodiments of the present technology utilize a staggered firing scheme to separate the transition of signals on the global data lines to reduce coupling within the global data lines that is often caused by simultaneous switching.

Figure 1:
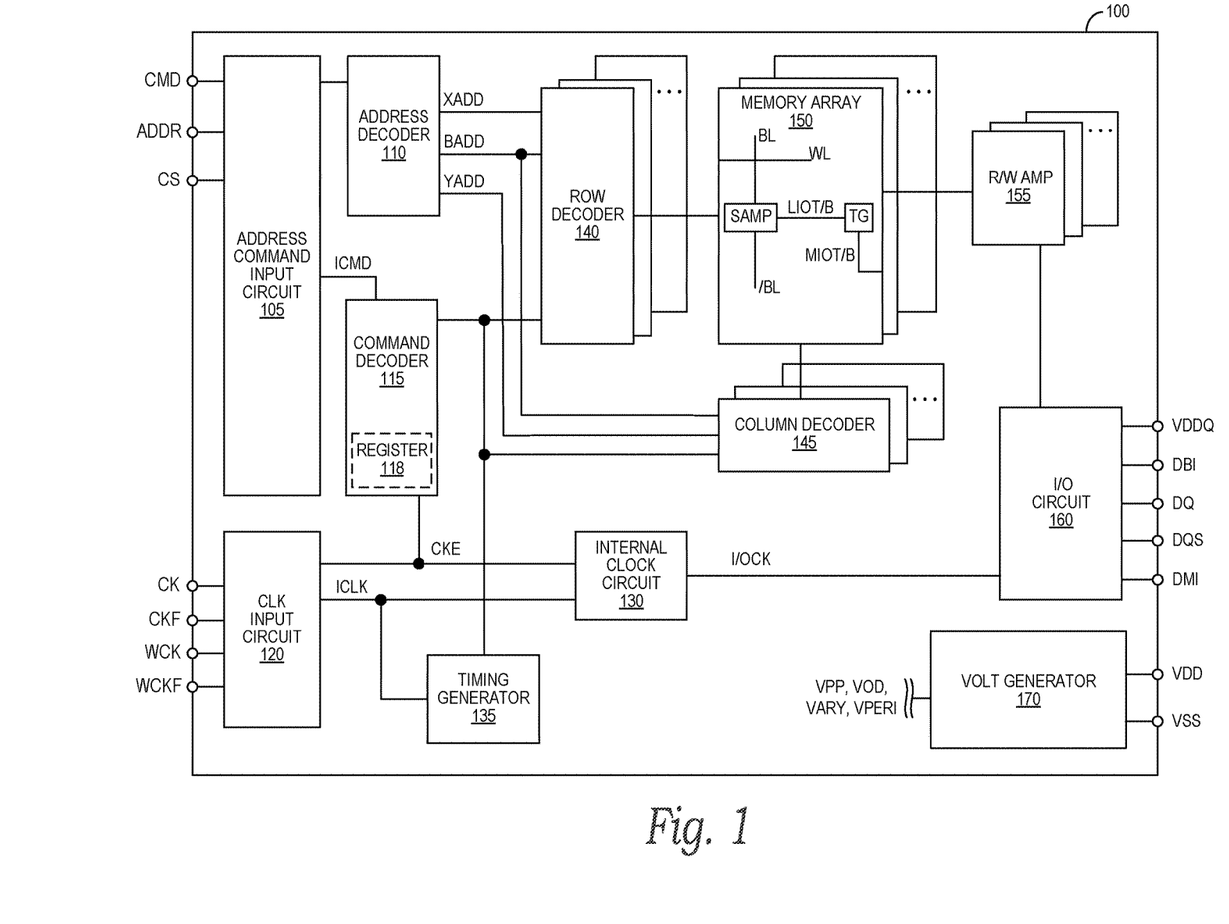
FIG. 1 is a block diagram schematically illustrating a memory device configured in accordance with an embodiment of the present technology.

FIG. 1 is a block diagram schematically illustrating a memory device 100 configured in accordance with an embodiment of the present technology. The memory device 100 can be connected to any one of a number of electronic devices capable of utilizing memory for the temporary or persistent storage of information, or a component thereof. For example, a host device of memory device 100 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to memory device 100, although in other embodiments, the host device may be indirectly connected to memory device (e.g., over a networked connection or through intermediary devices).

As shown in FIG. 1, the memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 150 may also include plate lines and corresponding circuitry for managing their operation.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK, CKF, WCK, and WCKF, data terminals DQ, DQS, DBI, and DMI, and power supply terminals VDD, VSS, VDDQ, and/or VSSQ.

As shown in FIG. 1, the clock terminals may be supplied with external clock signals and complementary external clock signals. The external clock signals CK, CKF, WCK, and WCKF can be supplied to a clock input circuit 120. The CK and CKF signals and the WCK and WCKF signals can be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level, the complementary clock signal transitions from the high clock level to the low clock level; and when the clock signal transitions from the high clock level to the low clock level, the complementary clock signal transitions from the low clock level to the high clock level.

Input buffers included in the clock input circuit 120 can receive the external clock signals. For example, when enabled by a CKE signal from command decoder 115, an input buffer can receive the CK and CKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signals based on the received internal clock signals ICLK and a clock enable signal CKE from command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (I/O) clock signals DOCK. The I/O clock signals DOCK can be supplied to I/O circuit 160 and can be used as a timing signal for determining an output timing of read data and the input timing of write data. The I/O clock signals DOCK can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

The command terminals and address terminals may be supplied with an address signal and a bank address signal from outside. The address signal and the bank address signal supplied to the address terminals can be transferred, via the command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to the command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command. The command decoder 115 may further include one or more registers 118 for tracking various counts or values.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in row decoder 140, the internal potentials VOD and VARY can be used in sense amplifiers included in memory array 150, and the internal potential VPERI can be used in many other circuit blocks.

The power supply terminal may also be supplied with power supply potential VDDQ and/or VSSQ. The power supply potential VDDQ can be supplied to input/output (I/O) circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

Figure 2:
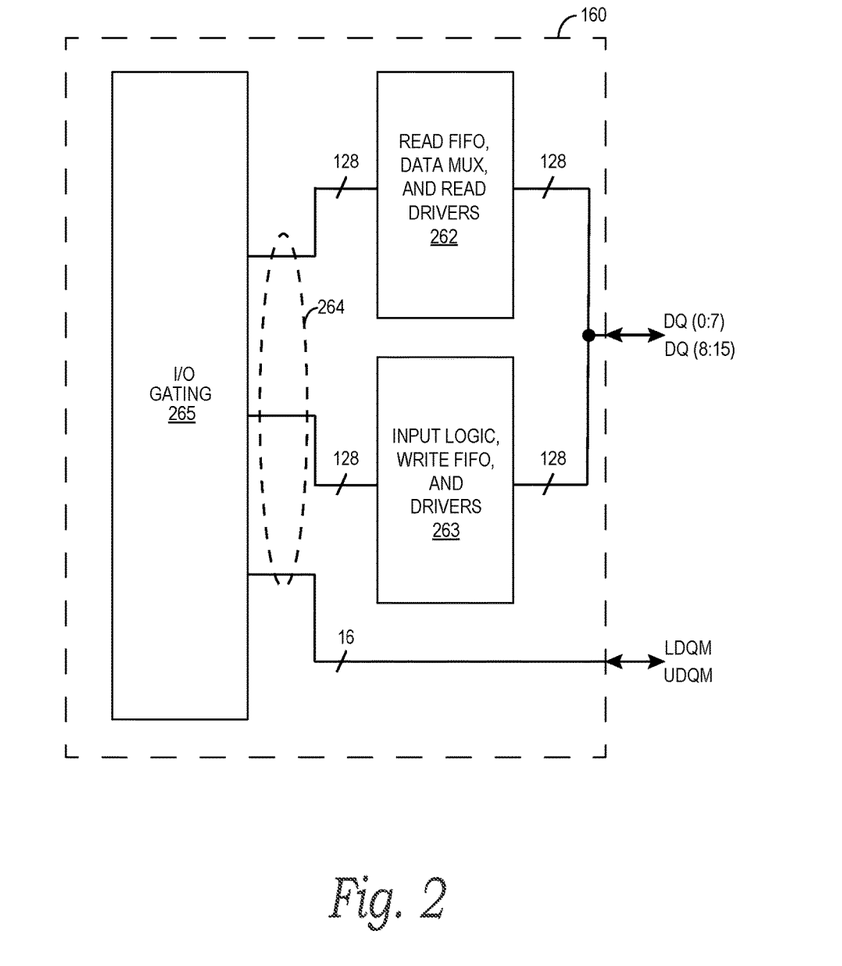
FIG. 2 is a block diagram schematically illustrating an input/out circuit configured in accordance with an embodiment of the present technology.

FIG. 2 is a block diagram schematically illustrating the input/output (I/O) circuit 160 of the memory device 100 configured in accordance with embodiments of the present technology. Well-known structures and functions of the I/O circuit 160 have not been shown or described in detail in FIG. 2 to avoid unnecessarily obscuring particular aspects of the present technology. Referring to FIGS. 1 and 2 together, when a read command is issued and a row address and a column address are timely supplied with the read command, read data can be read from memory cells in the memory array 150 (FIG. 1) designated by the row address and column address. The read command may be received by the command decoder 115 (FIG. 1), which can provide internal commands to the I/O circuit 160 so that read data can be output from data terminals via read/write amplifiers 155 (FIG. 1) and the I/O circuit 160. More specifically, the read data can be output via the read/write amplifiers 155 and I/O gating 265 (FIG. 2) onto global data lines of an internal data bus 264 (FIG. 2) within the I/O circuit 160. The global data lines of the internal data bus 264 can transfer the read data through a read FIFO, a data mux, read drivers 262 (FIG. 2) and/or through other circuits and/or components (not shown) of the I/O circuit 160 to the data terminals DQ(0:7), DQ(8:15), LDQM, UDQM, DQS (FIG. 1), DBI (FIG. 1), and/or DMI (FIG. 1) according to the DOCK clock signal.

The read data may be provided at a time defined by read latency information that can be programmed in the memory device 100, for example, in a mode register (not shown in FIG. 1 or 2). The read latency information can be defined in terms of clock cycles of the CK clock signal (FIG. 1). For example, the read latency information can be a number of clock cycles of the CK signal after the read command is received by the memory device 100 when the associated read data is provided.

When a write command is issued and a row address and a column address are timely supplied with the command, write data can be supplied to the data terminals DQ(0:7), DQ(8:15), LDQS, UDQS, LDQM, UDQM, DBI, and/or DMI according to the I/DOCK clock signal. The write command may be received by the command decoder 115 (FIG. 1), which can provide internal commands to the I/O circuit 160 so that the write data can be received by data receivers in the input/output circuit 160, and supplied via the input/output circuit 160 and the read/write amplifiers 155 (FIG. 1) to the memory array 150 (FIG. 1). More specifically, the write data can be transferred via the global data lines of the internal data bus 264 through input logic, a write FIFO, write drivers 263 (FIG. 2) and/or other circuits and/or components (not shown) of the I/O circuit 160, through I/O gating 265 (FIG. 2), and/or through the read/write amplifiers 155 to the memory array 150.

The write data may be written in the memory cell designated by the row address and the column address. The write data may be provided to the data terminals at a time that is defined by write latency information. The write latency information can be programmed in the memory device 100, for example, in the mode register (not shown in FIG. 1 or 2). The write latency information can be defined in terms of clock cycles of the CK clock signal. For example, the write latency information can be a number of clock cycles of the CK signal after the write command is received by the memory device 100 when the associated write data is received.

As discussed above, the global data lines are bi-directional signal paths that carry read and/or write data from and/or to the memory array 150 (FIG. 1) and/or the data terminals DQ(0:7) and/or DQ(8:15) (FIG. 2) of the memory device 100. For a DDR4 memory device, each data terminal DQ0-DQ15 operates in a burst of eight bits for a total of 128 global data lines. The I/O circuit also includes 16 data mask lines (one data mask line per eight global data lines) that carry signals from data mask terminals LDQM and UDQM to the I/O gating 265. The data mask lines are used to suppress data input/output of the memory device 100. For example, when a data mask line is asserted in a first state (e.g., in a high state), data on the corresponding global data lines is not written to the memory array 150 and/or is not output from the data terminals DQ(0:7) and/or DQ(8:15).

Depending on the configuration of the memory device 100, all or a subset of the global data lines and/or the data mask lines on the internal data bus 264 are used. For example, in a X16 configuration of the memory device 100, all of the data terminals DQ(0:7) and DQ(8:15), the 128 corresponding global data lines, both data mask terminals LDQM and UDQM, and the 16 corresponding data mask lines are used. In X4 and/or X8 configurations of the memory device 100, on the other hand, only the lower data terminals DQ(0:7), the 64 corresponding global data lines, the lower data mask terminal LDQM, and/or the eight corresponding data mask lines are used. In these configurations, the data mask lines corresponding to the upper data mask terminal UDQM can be tied to a first state (e.g., a high state) to mask activity on the portion of the internal data bus 264 corresponding to the upper data terminals DQ(8:15).

Figure 3:
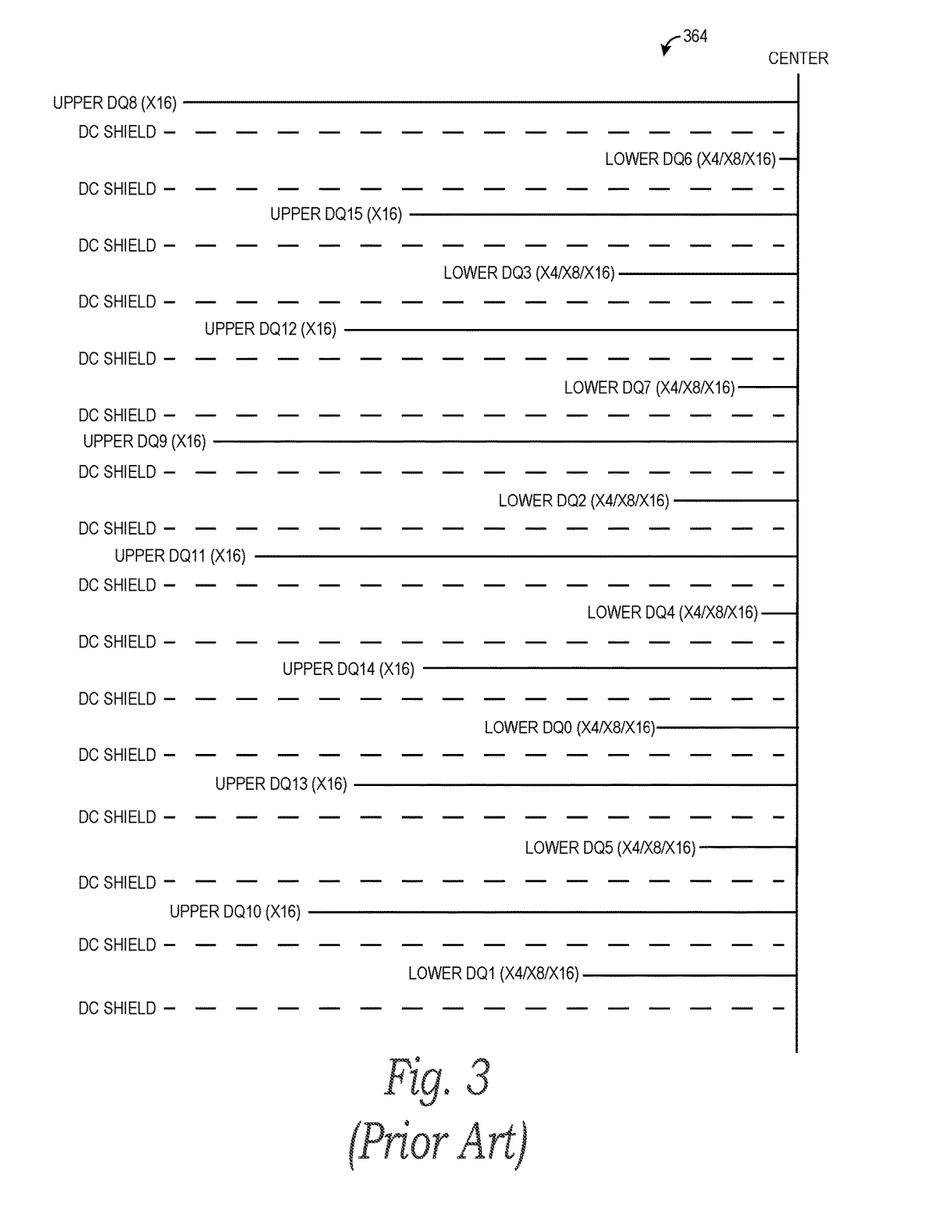
FIG. 3 is a schematic view of a global data path of an internal data bus on a memory device.

FIG. 3 is a schematic view of a global data path on an internal data bus 364 of a memory device. As shown, the lengths of the global data lines from the data terminals DQ(0:7) and DQ(8:15) to the center of the memory device can vary. For example, the upper data terminals DQ(8:15) can be located near an edge of the memory device, meaning that the corresponding global data lines can span as much as half the width of the memory device from the upper data terminals DQ(8:15) to the center of the memory device. In contrast, the lower data terminals DQ(0:7) can be located closer to the center of the memory device such that the lengths of the corresponding global data lines are much shorter but still vary depending on the location of the data terminals DQ0-DQ7.

During read and/or write operations, data bits are transmitted one at a time to the center of the memory device according to edge(s) of the input/output clock signal DOCK. At the center of the memory device, the data bits are lined up and then routed to one or more memory banks in the memory array 150 and/or to the data terminals DQ(0:7) and/or DQ(8:15) (e.g., according to a zero to parallel operation). The varying lengths in the global data lines, however, can create delays in reception of data transmitted over the lines. Therefore, as wide I/O data is transmitted according to high-speed read and/or write operations, the chance that data is driven over adjacent global data lines at the same time increases. When data is driven over adjacent global data lines at the same time, coupling within the data lines can occur, which can distort the transmitted signals. For example, if signals on two global data lines attempt to switch into a first state (e.g., a high state) when a signal on another global data line between the two global data lines attempts to switch into a second state (e.g., a low state), the two global data lines can become aggressors and can pull the signal on the other global data into the first state instead of the second state. Thus, the other global data line can become a victim, and an error in the data bit transmitted on the victim global data line can occur.

To address this concern, many memory devices utilize bi-directional buffers (not shown) along and/or DC shield lines between the global data lines to maintain signal integrity. As shown in FIG. 3, for example, DC shield lines are routed between each pair of global data lines in the internal data bus 364 and along the edges of the internal data bus 364 (e.g., for a total of 146 DC shield lines). The DC shield lines can be tied to VDD, GND, or some other static signal such that the signals on these lines remain in the same state. As a result, coupling within the global data lines is unlikely to occur because the DC shield lines separate the global data lines and do not switch while the signals on the global data lines switch.

These DC shield lines, however, take up space within the memory device 100 and increase the global data path footprint (i.e., the size of the internal data bus 364) of the memory device. In addition, several of the global data lines (e.g., the data lines corresponding to the upper data terminals DQ(8:15)) go unused in X4 and/or X8 memory device configurations.

Figure 4:
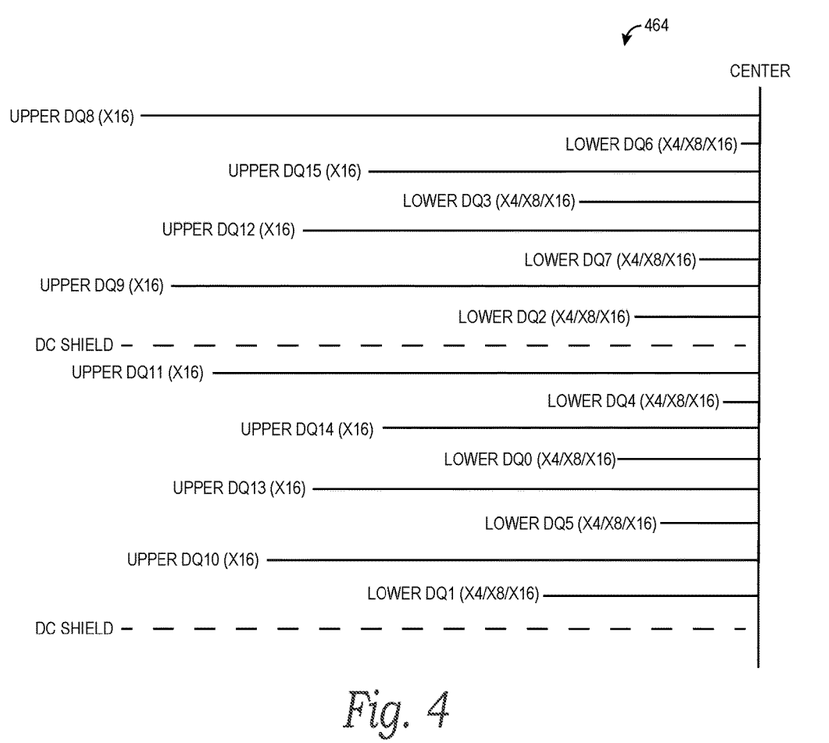
FIG. 4 is a schematic view of a global data path of an internal data bus on a memory device configured in accordance with an embodiment of the present technology.

FIG. 4 is a schematic view of a global data path on an internal data bus 464 of a memory device 100 configured in accordance with an embodiment of the present technology. As shown, the internal data bus 464 uses the global data lines corresponding to the upper data terminals DQ(8:15) to shield the global data lines corresponding to the lower data terminals DQ(0:7). As a result, all but the edge DC shield lines are eliminated in the internal data bus 464 illustrated in FIG. 4. In this manner, the global data path footprint (i.e., the size of the internal data bus 464) can be significantly reduced (e.g., by 144 DC shield lines).

To counter the possibility of coupling within the global data lines in X4 and X8 memory device configurations and to maintain signal integrity, the data mask lines corresponding to the upper data mask terminal UDQM can be tied and/or forced to a first state (e.g., a high state) to mask activity on this portion of the internal data bus 464. Additionally or alternatively, the global data lines corresponding to the upper data terminals DQ(8:15) can be tied and/or forced to a constant state (e.g., a constant low and/or a constant high state). In this manner, the global data lines corresponding to the upper data terminals DQ(8:15) can act as DC shield lines for the global data lines corresponding the lower data terminals DQ(0:7).

Alternatively and/or in a X16 memory device configuration, the memory device 100 can be configured to utilize a staggered firing scheme to reduce coupling within the global data lines caused by simultaneous switching. For example, short global data lines on the internal data bus 464 corresponding to the lower data terminals DQ(0:7) can be alternated with long global data lines on the internal data bus 464 corresponding to the upper data terminals DQ(8:15). As such, the memory device 100 can separate transition of signals on adjacent global data lines in the internal data bus 464 by leveraging the natural delay present on the longer global data lines corresponding to the upper data terminals DQ(8:15) because of their larger lengths. In particular, during a write operation, data transmitted on the shorter global data lines corresponding to lower data terminals DQ(0:7) will reach the center of the memory device 100 more quickly than data transmitted on the longer global data lines corresponding to upper data terminals DQ(8:15). Thus, the memory device 100 can switch the global data lines corresponding the lower data terminals DQ(0:7) before switching the global data lines corresponding to the upper data terminals DQ(8:15). Data transmitted on the shorter global data lines can then be passed to repeaters (not shown) at the center of the memory device 100 while the memory device 100 switches the longer global data lines corresponding to the upper data terminals DQ(8:15). In these and other embodiments, the memory device 100 can use other components (not shown) of the I/O circuit 160 (e.g., buffers), materials, and/or configurations to add, adjust, and/or factor out delay as desired such that the memory device 100 can separate the transition of the signals on adjacent global data lines in the internal data bus 464. For example, the longer global data lines corresponding the upper data terminals DQ(8:15) can be fast Metal 3 lines and run on top of the shorter global data lines corresponding the lower data terminals DQ(0:7) that are slower Metal 1 lines. In accordance with write operations, the memory device 100 can then align the data in the center of the memory device 100 and can route the data to one or more memory banks in the memory array 150.

During a read operation, data transmitted on the longer global data lines corresponding to the upper data terminals DQ(8:15) takes longer to reach the upper data terminals DQ(8:15) than data transmitted from the center of the memory device 100 to the lower data terminals DQ(0:7) on the shorter global data lines. Thus, the memory device 100 can send read data on the longer global data lines before sending read data on the shorter global data lines. Accordingly, the memory device 100 can switch the global data lines corresponding to the upper data terminals DQ(8:15) before and/or after switching the global data lines corresponding to the lower data terminals DQ(0:7). In these and other embodiments, the memory device 100 can use other components (not shown) of the I/O circuit 160 (e.g., buffers), materials, and/or configurations to add, adjust, and/or factor out delay as desired such that the memory device 100 can separate the transitions of the signals on adjacent global data lines in the internal data bus 464.

In this manner, the memory device 100 can improve bussing of power in the internal data bus 464 by preventing data on the global data lines corresponding to the lower data terminals DQ(0:7) from being driven at the same time as data on the global data lines corresponding to the upper data terminals DQ(8:15). As a result, cross talk between and coupling within adjacent global data lines in the internal data bus 464 is minimized and/or eliminated, thereby avoiding degradation of the signals transmitted over the global data lines of the internal data bus 464. In addition, by continuously switching the data path during burst read and/or burst write access modes, the memory device 100 can minimize overshoot and undershoot of signals on the internal data bus 464 due to coupling. This can maintain high signal integrity despite eliminating most of the DC shield lines from the internal data bus 464.

Figure 5:
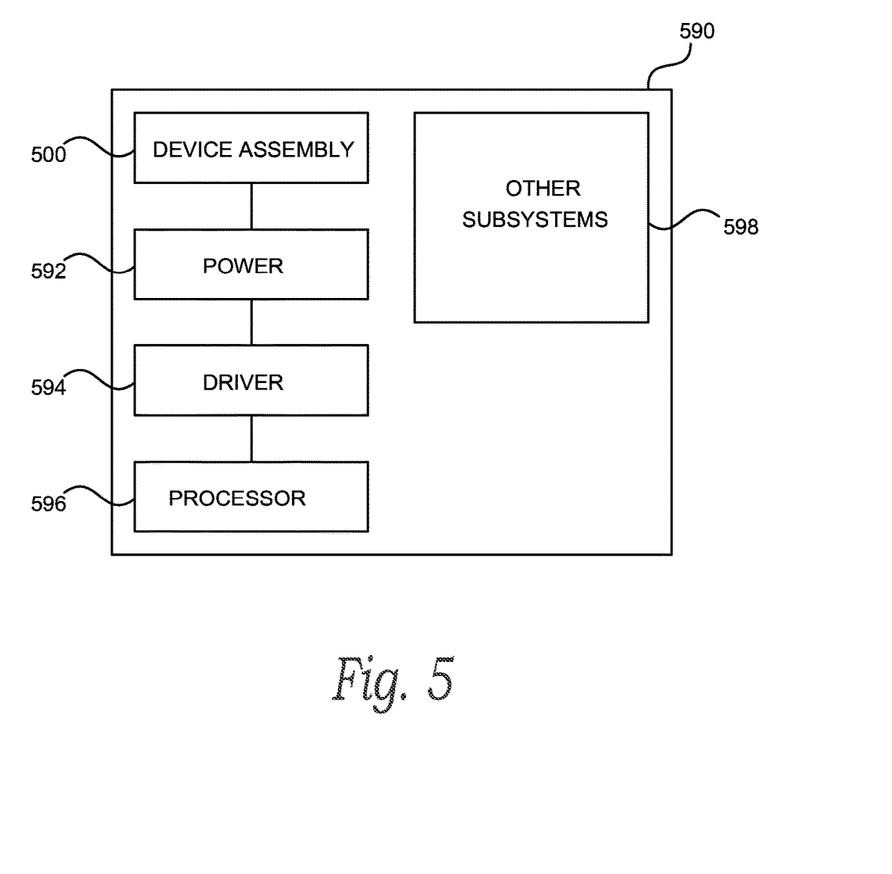
FIG. 5 is a schematic view of a system that includes a memory device configured in accordance with embodiments of the present technology.

FIG. 5 is a schematic view of a system that includes a memory device in accordance with embodiments of the present technology. Any one of the foregoing memory devices described above with reference to FIGS. 1-4 can be incorporated into any of a myriad of larger and/or more complex systems, a representative example of which is system 590 shown schematically in FIG. 5. The system 590 can include a semiconductor device assembly 500, a power source 592, a driver 594, a processor 596, and/or other subsystems and components 598. The semiconductor device assembly 500 can include features generally similar to those of the memory device described above with reference to FIGS. 1-4, and can, therefore, include various features of memory content authentication. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, vehicles, appliances, and other products. Components of the system 590 may be housed in a single unit or distributed over multiple, interconnected units (e.g., through a communications network). The components of the system 590 can also include remote devices and any of a wide variety of computer readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps are presented in a given order, alternative embodiments may perform steps in a different order. The various embodiments described herein may also be combined to provide further embodiments.

The above detailed descriptions of embodiments of the technology are also not intended to limit the technology to the precise application disclosed above. Instead, various components and/or functions of the technology can be implemented in other applications. For example, various components and/or functions of the technology described above can be implemented to shield column address lines with row address lines in the address decoder 110, the row decoder 140, the column decoder 145, and/or the memory array 150 of the memory device 100 (FIG. 1). Additionally or alternatively, various components and/or functions of the technology described above can be implemented to shield bank activation command lines with read and/or write operation command lines in the address command input circuit 105, the address decoder 110, the command decoder 115, the row decoder 140, the column decoder 145, and/or the memory array 150 of the memory device 100.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

From the foregoing, it will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. A memory device, comprising:
   a memory array;
   lower data terminals;
   upper data terminals; and
   an input/output (I/O) circuit including an internal, global data bus electrically coupling the lower and the upper data terminals to the memory array,
   wherein—
   the internal, global data bus includes a first plurality of global data lines corresponding to the lower data terminals and a second plurality of global data lines corresponding to the upper data terminals,
   each global data line of the first plurality of global data lines and each global data line of the second plurality of global data lines corresponds to every memory cell of the memory array,
   the second plurality of global data lines are directly interleaved between the first plurality of global data lines, and
   the second plurality of global data lines are configured to shield the first plurality of global data lines.

2. The memory device of claim 1 further comprising a center, wherein the upper data terminals are located at a first location in the memory device, and wherein the lower data terminals are located at a second location in the memory device closer to the center of the memory device than the first location.

3. The memory device of claim 2, wherein the first plurality of global data lines are shorter in length than the second plurality of global data lines.

4. The memory device of claim 1, wherein the I/O circuit is configured to drive the second plurality of global data lines to a constant state when the second plurality of global data lines are not used to transfer data to and/or from the memory array.

5. The memory device of claim 4, wherein the I/O circuit further includes a lower data mask terminal, an upper data mask terminal, a first plurality of data mask lines corresponding to the lower data mask terminal, and a second plurality of data mask lines corresponding to the upper data mask terminal, and wherein the I/O circuit is configured to force the second plurality of data mask lines to a high state to mask signals transmitted on the second plurality of global data lines.

6. The memory device of claim 1, wherein the I/O circuit is configured to (i) switch the first plurality of global data lines at a first time when the second plurality of global data lines are not being switched and (ii) switch the second plurality of global data lines at a second time when the first plurality of global data lines are not being switched, and wherein the second time is after the first time.

7. The memory device of claim 6, wherein the I/O circuit is further configured to pass signals transmitted on the first plurality of global data lines to repeaters at a center of the memory device to account for delay in reception of signals transmitted on the second plurality of global data lines, and wherein the delay in reception is due to larger lengths of the second plurality of global data lines than lengths of the first plurality of global data lines.

8. The memory device of claim 7, wherein the I/O circuit further includes one or more buffers, and wherein the delay in reception is based at least in part on the one or more buffers.

9. The memory device of claim 6, wherein the I/O circuit is configured to continuously switch the first and second pluralities of global data lines during burst read and/or burst write access modes.

10. The memory device of claim 1 further comprising DC shield lines, wherein the DC shield lines are located at edges of the internal, global data bus.

11. The memory device of claim 10, wherein the DC shield lines are tied to one of a power supply and a ground such that the DC shield lines transmit a continuous, static signal.

12. A memory system, comprising:
a host device; and
a memory device including—
   a memory array; and
   an input/output (I/O) circuit including an internal, global data bus having a first plurality of global data lines and a second plurality of global data lines, wherein—
      each global data line of the first plurality of global data lines and each global data line of the second plurality of global data lines corresponds to every memory cell of the memory array,
      the second plurality of global data lines are directly interleaved between the first plurality of global data lines, and
      the second plurality of global data lines are configured to shield the first plurality of global data lines.

13. The memory system of claim 12, wherein the first plurality of global data lines are shorter in length than the second plurality of global data lines.

14. The memory system of claim 13, wherein the I/O circuit is configured to (i) switch the first plurality of global data lines at a first time when the second plurality of global data lines are not being switched and (ii) switch the second plurality of global data lines at a second time when the first plurality of global data lines are not being switched, and wherein the second time is after the first time.

15. The memory system of claim 14, wherein the I/O circuit is further configured to pass signals transmitted on the first plurality of global data lines to repeaters at a center of the memory device to account for delay in reception of signals transmitted on the second plurality of global data lines, and wherein the delay in reception is due to the larger lengths of the second plurality of global data lines than the lengths of the first plurality of global data lines.

16. The memory system of claim 12, wherein the internal global data bus further includes DC shield lines at edges of the internal, global data bus, and wherein the DC shield lines are tied to one of a power supply and a ground such that the DC shield lines transmit a continuous, static signal.

17. An input/output (I/O) circuit for use in a memory device, the I/O circuit comprising an internal, global data bus including a first plurality of global data lines and a second plurality of global data lines, wherein—
   each global data line of the first plurality of global data lines and each global data line of the second plurality of global data lines corresponds to every memory cell of a memory array of the memory device;
   the second plurality of global data lines are directly interleaved between the first plurality of global data lines; and
   the second plurality of global data lines are configured to shield the first plurality of global data lines.

18. The I/O circuit of claim 17, wherein the I/O circuit is configured to drive the second plurality of global data lines to a constant state when the second plurality of global data lines are not used to transfer data.

19. The I/O circuit of claim 17, wherein the I/O circuit is configured to (i) switch the first plurality of global data lines at a first time when the second plurality of global data lines are not being switched and (ii) switch the second plurality of global data lines at a second time when the first plurality of global data lines are not being switched, and wherein the second time is after the first time.

20. The I/O circuit of claim 17, wherein the internal, global data bus further includes DC shield lines at edges of the internal, global data bus, and wherein the DC shield lines are tied to one of a power supply and a ground such that the DC shield lines transmit a continuous, static signal.

* * * * *